United States Patent
Krishnamurthi (10) Patent No.: US 10,637,398 B1
(45) Date of Patent: Apr. 28, 2020

(54) POWER EFFICIENT TRIPLE-BALANCED RADIO FREQUENCY MIXERS

(71) Applicant: BAE SYSTEMS INFORMATION AND ELECTRONIC SYSTEMS INTEGRATION INC., Nashua, NH (US)

(72) Inventor: Kathiravan Krishnamurthi, Westford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/399,133

(22) Filed: Apr. 30, 2019

(51) Int. Cl.
*H03D 7/14* (2006.01)

(52) U.S. Cl.
CPC ......... *H03D 7/1491* (2013.01); *H03D 7/1433* (2013.01); *H03D 2200/009* (2013.01); *H03D 2200/0023* (2013.01); *H03D 2200/0088* (2013.01)

(58) Field of Classification Search
CPC ...... H03D 7/14; H03D 7/1425; H03D 7/1433; H03D 7/1441; H03D 7/1458; H03D 7/1491; H03D 2200/0023; H03D 2200/0088; H03D 2200/009
USPC ......................................... 327/355, 356, 359
See application file for complete search history.

(56) References Cited

U.S. PATENT DOCUMENTS

| | | | |
|---|---|---|---|
| 3,891,934 A | 6/1975 | Norton et al. | |
| 6,172,563 B1 | 1/2001 | Trask | |
| 6,271,721 B1 | 8/2001 | Trask | |
| 9,385,657 B1* | 7/2016 | Daftari | H03D 7/1441 |
| 2003/0216131 A1* | 11/2003 | Kovacevic | H03D 7/1425 455/326 |
| 2004/0214547 A1* | 10/2004 | Kim | H03D 7/1433 455/296 |

OTHER PUBLICATIONS

Danielle Cuffing, Effects of Offsets on Bipolar Integrated Circuit Mixer Even-Order Distortion Terms, IEEE Transactions on Microwave Theory and Techniques, Jan. 2001, pp. 23-30, vol. 49, No. 1.
Dallas Lankford, Common Base Transformer Feedback Norton Amplifiers (formerly Ultralinear 2N5109 and 2N3053 Amplifiers), pp. 1-10, 8 VI 94, rev. 21 07, found at http://www.thegleam.com/ke5fx/norton/lankford.pdf. Document is undated but the document was printed from the pertinent website on Apr. 23, 2019.

* cited by examiner

*Primary Examiner* — William Hernandez
(74) *Attorney, Agent, or Firm* — Sand, Sebolt & Wernow LPA (57) ABSTRACT

A triple-balanced radio frequency (RF) mixer including a plurality of double-balanced mixer cells and a plurality of transformers is disclosed. Each of the plurality of transformers includes a primary and a secondary. Each primary is connected in series. Each secondary is connected across one double-balanced mixer cell of said plurality of double-balanced mixer cells. The triple-balanced RF mixer further includes a local oscillator (LO) port coupled to each of the plurality of double-balanced mixer cells in parallel, an output port coupled to each of the plurality of double-balanced mixer cells in parallel, and at least one non-ideality source providing at least one-non-ideality. The at least one non-ideality is cancelled at the output port.

20 Claims, 8 Drawing Sheets

POWER EFFICIENT TRIPLE-BALANCED RADIO FREQUENCY MIXERS

BACKGROUND

Technical Field

The present disclosure relates to systems and methods for communication systems. More particularly, the present disclosure relates to radio frequency (RF) mixers. Specifically, the present disclosure relates to power efficient triple-balanced RF mixers which cancel random and systematic spurs and leakages.

Background Information

Double-balanced diode and active field effect transistor (FET)/bipolar junction transistor (BJT) mixers are widely used in the commercial radio industry and the military radio industry. Double-balanced diode and active FET/BJT mixers typically have three ports, a local oscillator (LO) port, a radio frequency (RF) port, and an intermediate frequency (IF) port. The RF port and the IF port are interchangeable between input ports and outport ports depending on the application. Typically, the RF port serves as an output port and the IF port serves as the input port when the mixer is performing an upconversion, and the RF port serves as the input port and the IF port serves as the output port when the mixer is performing a downconversion.

Some drawbacks associated with double-balanced diode and active FET/BJT mixers include mismatch combinations and offsets present in the mixers. For example, random offsets that are process dependent affect the symmetry and balanced nature of double-balanced diode and active (FET)/BJT mixers. Ideally, a perfectly balanced mixer will have zero LO signal leakage, which may also be referred to as LO carrier leakage, and infinite second order intercept point (IP2), which is a measure of linearity that quantifies the second-order distortion generated by nonlinear systems and devices. However, practical implementations of double-balanced diode and active (FET)/BJT mixers have unequal line lengths, lack of symmetry in baluns, and imperfect balance.

One way to address the above-mentioned shortcomings is by designing triple-balanced mixers, which combines two double-balanced mixers and may also be referred to as a doubly double-balanced mixer. One conventional triple-balanced mixer utilizes two Gilbert cell mixers which utilize transconductor cells. However, Gilbert cell mixers require high supply voltages which are undesirable. Further, the transconductor cells introduce offsets that degrade the symmetry of the triple-balanced mixer configuration. These random offsets increase LO carrier leakage and degrade the in-band IP2 spurs in wide-band systems.

SUMMARY

There remains a need in the art for an improved triple-balanced RF mixer. The present disclosure addresses these and other issues.

In one aspect, the present disclosure may provide a triple-balanced radio frequency (RF) mixer comprising a plurality of double-balanced mixer cells; a plurality of transformers; wherein each of the plurality of transformers includes a primary and a secondary; wherein each primary is connected in series; wherein each secondary is connected across one double-balanced mixer cell of said plurality of double-balanced mixer cells; a local oscillator (LO) port coupled to each of the plurality of double-balanced mixer cells in parallel; an output port coupled to each of the plurality of double-balanced mixer cells in parallel; and at least one non-ideality source providing at least one non-ideality; wherein the at least one non-ideality is cancelled at the output port. In one example, the at least one non-ideality is a second order intermodulation product. In another example, the at least one non-ideality is LO carrier leakage.

The triple-balanced RF mixer further includes a nominal double-balanced mixer cell of said plurality of double-balanced mixer cells; and an inverted double-balanced mixer cell of said plurality of double-balanced mixer cells; wherein the inverted double-balanced mixer cell is an inverted configuration of the nominal double-mixer cell.

The at least one non-ideality may include a first non-ideality and a second non-ideality. The first non-ideality and the second non-ideality are canceled across the output port. The first non-ideality may include a first phase and the second non-ideality may include a second phase opposite the first phase.

The triple-balanced RF mixer further includes a plurality of current sources providing a total double-balanced mixer cell current to the plurality of double-balanced mixer cells. The total double-balanced mixer cell current may be split substantially equally between the plurality of double-balanced mixer cells.

The triple-balanced RF mixer further includes a total double-balanced mixer cell impedance presented by the plurality of double-balanced mixer cells; an input port of the triple-balanced mixer; and an RF source impedance presented to the input port; wherein the total double-balanced mixer cell impedance is substantially matched to the RF source impedance. The plurality of transformers may modify the total double-balanced mixer cell impedance.

The triple-balanced RF mixer further includes a first amplifier mechanism connected to one of the plurality of double-balanced mixer cells; and a second amplifier mechanism connected to another of the plurality of double-balanced mixer cells; wherein the first amplifier mechanism is adapted to feed a differential LO signal to one of the plurality of double-balanced mixer cells; and wherein the second amplifier mechanism is adapted to feed the differential LO signal to another of the plurality of double-balanced mixer cells.

The triple-balanced RF mixer may be implemented in an integrated circuit technology. In one example, the integrated circuit technology is a silicon BiCMOS integrated circuit. In another example, the integrated circuit technology is a gallium arsenide (GaAs) integrated circuit.

The triple-balanced RF mixer further includes a voltage supply. In one example, the voltage supply is less than approximately three volts. In another example, the voltage supply is equal to or less than approximately two volts.

The plurality of double-balanced mixer cells may include a first double-balanced mixer cell having a first transistor pair and a second transistor pair and a second double-balanced mixer cell having a third transistor pair and a fourth transistor pair. The output port may include a positive output terminal connected to the first transistor pair and the third transistor pair and a negative output terminal connected to the second transistor pair and the fourth transistor pair.

The at least one non-ideality may include a first non-ideality, a second non-ideality, a third non-ideality, and a fourth non-ideality. The first non-ideality and the third non-ideality may be canceled across the positive output terminal and the second non-ideality and the fourth non-ideality may be canceled across the negative output terminal.

In one example, the triple-balanced RF mixer further includes a single-ended input port connected to one primary of the plurality of transformers. In another example, the triple-balanced RF mixer may include a differential input port having a first input terminal connected to one primary of the plurality of transformers and a second input terminal connected to another primary of the plurality of transformers.

In another aspect, the present disclosure may provide a triple-balanced radio frequency (RF) mixer, comprising a first pair of power efficient double-balanced mixer cells, wherein one of said first pair is an inverted power efficient double-balanced mixer cell of the other of said first pair; a first pair of transformers each having spiral baluns having a primary and a secondary, wherein each primary is connected in series and each secondary is connected across one power efficient double-balanced mixer cell of said first pair of power efficient double-balanced mixer cells such that an RF signal is split into two balanced inputs, wherein one of the inputs is inverted; a local oscillator (LO) port coupled to each of the power efficient double-balanced mixer cells in parallel; and an output port coupled to each of the power efficient double-balanced mixer cells in parallel.

The triple-balanced RF mixer further includes at least one of a second order intermodulation product and an inverted LO feedthrough provided by the inverted power efficient double-balanced mixer cell. The triple-balanced RF mixer further includes a total power efficient double-balanced mixer cell impedance presented by the first pair of power efficient double-balanced mixer cells; an input port of the triple-balanced RF mixer; and an RF source impedance presented to the input port; wherein the total power efficient double-balanced mixer cell impedance is substantially matched to the RF source impedance.

The triple-balanced RF mixer further includes a second pair of power efficient double-balanced mixer cells, wherein one of said second pair is an inverted power efficient double-balanced mixer cell of the other of said second pair; and a second pair of transformers each having spiral baluns having a primary and a secondary, wherein each primary is connected in series and each secondary is connected across one power efficient double-balanced mixer of the second pair of power efficient double-balanced mixer cells cell such that an RF signal is split into two balanced inputs, wherein one of the inputs is inverted.

In another aspect, the present disclosure may provide a triple-balanced radio frequency (RF) mixer including a plurality of double-balanced mixer cells and a plurality of transformers. Each of the plurality of transformers includes a primary and a secondary. Each primary is connected in series. Each secondary is connected across one double-balanced mixer cell of said plurality of double-balanced mixer cells. The triple-balanced RF mixer further includes a local oscillator (LO) port coupled to each of the plurality of double-balanced mixer cells in parallel, an output port coupled to each of the plurality of double-balanced mixer cells in parallel, and at least one non-ideality source providing at least one-non-ideality. The at least one non-ideality is cancelled at the output port.

BRIEF DESCRIPTION OF THE SEVERAL VIEWS OF THE DRAWINGS

Sample embodiments of the present disclosure are set forth in the following description, is shown in the drawings and is particularly and distinctly pointed out and set forth in the appended claims.

Similar numbers refer to similar parts throughout the drawings.

DETAILED DESCRIPTION

Figure 1A:
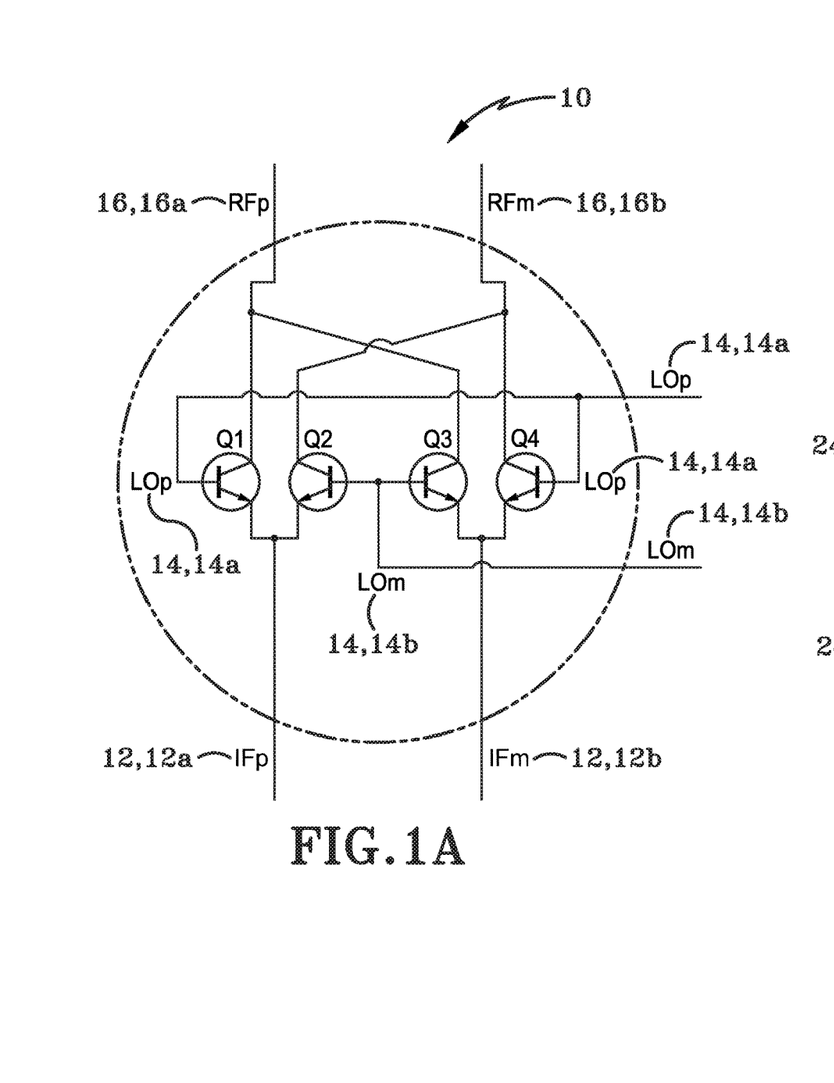
FIG. 1A is a schematic view of a first embodiment of a double-balanced mixer cell in accordance with one aspect of the present disclosure.

FIG. 1A is a schematic view of a double-balanced mixer cell 10, which may also be referred to as a first double-balanced mixer cell, in accordance with one aspect of the present disclosure. The first double-balanced mixer cell 10 includes a differential IF input port 12 having a first intermediate frequency (IF) input terminal 12a, which may also be referred to as a positive IF input terminal IFp, and a second IF input terminal 12b, which may also be referred to as a negative IF input terminal IFm, a differential voltage local oscillator (LO) input port 14 having a first LO input terminal 14a, which may also be referred to as a positive LO input terminal LOp, and a second LO input terminal 14b, which may also be referred to as a negative LO input terminal LOm, and a differential RF output port 16 having a first RF output terminal 16a, which may also be referred to as a positive RF input terminal RFp, and a second RF output terminal 16b, which may also be referred to as a negative RF input terminal RFm. The first double-balanced mixer cell 10 further includes a first transistor Q1, a second transistor Q2, a third transistor Q3, and a fourth transistor Q4.

The emitter of the first transistor Q1 is connected to the positive IF input terminal IFp, the base of the first transistor Q1 is connected to the positive LO input terminal LOp, and the collector of the first transistor Q1 is connected to the positive RF input terminal RFp. The emitter of the second transistor Q2 is connected to the positive IF input terminal IFp, the base of the second transistor Q2 is connected to the negative LO input terminal LOm, and the collector of the second transistor Q2 is connected to the negative RF input terminal RFm. The emitter of the third transistor Q3 is connected to the negative IF input terminal IFm, the base of the third transistor Q3 is connected to the negative LO input terminal LOm, and the collector of the third transistor Q3 is connected to the positive RF input terminal RFp. The emitter of the fourth transistor Q4 is connected to the negative IF input terminal IFm, the base of the fourth transistor Q4 is connected to the positive LO input terminal LOp, and the collector of the fourth transistor Q4 is connected to the negative RF input terminal RFm.

Although the first double-balanced mixer cell 10 has been described as having a differential IF input port 12 having a first intermediate frequency (IF) input terminal 12a a second IF input terminal 12b and a differential RF output port 16 having a first RF output terminal 16a and a second RF output terminal 16b, it is to be entirely understood that the IF input port 12 and the RF output port 16 may be switched depending on whether the first double-balanced mixer cell 10 is performing an up-conversion or a down-conversion, where, typically, a higher frequency signal is typically referred to as an RF signal and a lower frequency signal is typically referred to as an IF signal. Further, although the input port, which is either the IF input port or the RF input port, has been described as being a differential input port, it is to be entirely understood that the input port may have a single-ended RF input port.

The operation of a power efficient double-balanced mixer cell that is substantially identical to the first double mixer cell 10 has been described in in PCT Application No. PCT/US18/20143, which is incorporated herein by reference as if fully set forth herein, and thus, for brevity purposes will not be described fully herein.

Figure 1B:
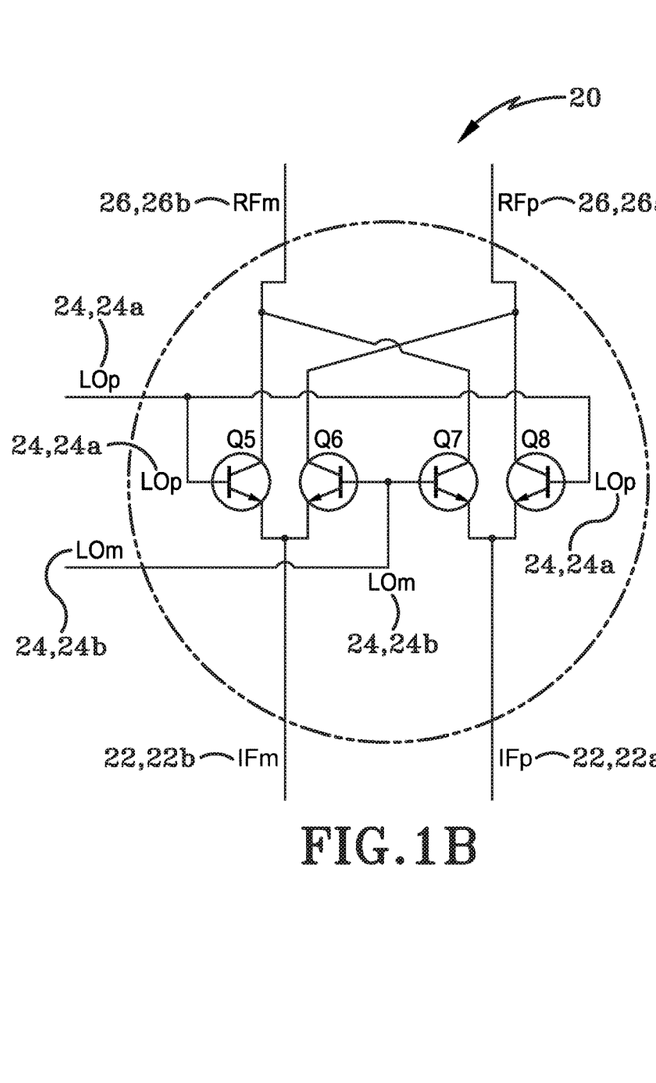
FIG. 1B is a schematic view of a second embodiment of a double-balanced mixer cell in accordance with one aspect of the present disclosure.

FIG. 1B is a schematic view of a double-balanced mixer cell 20, which may also be referred to as a second double-balanced mixer cell, in accordance with one aspect of the present disclosure. The second double-balanced mixer cell 20 includes a differential IF input port 22 having a first intermediate frequency (IF) input terminal 22a, which may also be referred to as a positive IF input terminal IFp, and a second IF input terminal 22b, which may also be referred to as a negative IF input terminal IFm, a differential voltage local oscillator (LO) input port 24 having a first LO input terminal 24a, which may also be referred to as a positive LO input terminal LOp, and a second LO input terminal 24b, which may also be referred to as a negative LO input terminal LOm, and a differential RF output port 26 having a first RF output terminal 26a, which may also be referred to as a positive RF input terminal RFp, and a second RF output terminal 26b, which may also be referred to as a negative RF input terminal RFm. The second double-balanced mixer cell 20 further includes a fifth transistor Q5, a sixth transistor Q6, a seventh transistor Q7, and an eighth transistor Q8.

The emitter of the fifth transistor Q5 is connected to the negative IF input terminal IFm, the base of the fifth transistor Q5 is connected to the positive LO input terminal LOp, and the collector of the fifth transistor Q5 is connected to the negative RF input terminal RFm. The emitter of the sixth transistor Q6 is connected to the negative IF input terminal IFm, the base of the sixth transistor Q6 is connected to the negative LO input terminal LOm, and the collector of the sixth transistor Q6 is connected to the positive RF input terminal RFp. The emitter of the seventh transistor Q7 is connected to the positive IF input terminal IFp, the base of the seventh transistor Q7 is connected to the negative LO input terminal LOm, and the collector of the seventh transistor Q7 is connected to the negative RF input terminal RFm. The emitter of the eighth transistor Q8 is connected to the positive IF input terminal IFp, the base of the eighth transistor Q8 is connected to the positive LO input terminal LOp, and the collector of the eighth transistor Q8 is connected to the positive RF input terminal RFp.

Although the second double-balanced mixer cell 20 has been described as having a differential IF input port 22 having a first intermediate frequency (IF) input terminal 22a and a second IF input terminal 22b, and a differential RF output port 26 having a first RF output terminal 26a and a second RF output terminal 26b, it is to be entirely understood that the IF input port 12 and the RF output port 26 may be switched depending on whether the second double-balanced mixer cell 20 is performing an up-conversion or a down-conversion, where, typically, a higher frequency signal is typically referred to as an RF signal and a lower frequency signal is typically referred to as an IF signal. Further, although the input port, which is either the IF input port or the RF input port, has been described as being a differential input port, it is to be entirely understood that the input port may have a single-ended RF input port.

The operation of a power efficient double-balanced mixer cell that is substantially identical to the second double mixer cell 20 has been described in has been described in PCT Application No. PCT/US18/20143, and thus, for brevity purposes will not be described fully herein.

In one example, the first double-balanced mixer cell 10 and the second double-balanced mixer cell 20 are bipolar junction transistor mixer cells; however the first double-balanced mixer cell 10 and the second double-balanced mixer cell 20 may be any suitable mixing mechanisms. Further, the first double-balanced mixer cell 10 and the second double-balanced mixer cell 20 may utilize any suitable transistors including, but not limited to, bipolar transistors, n-type field effect transistors (nFETs), pseudomorphic high-electron mobility transistors (pHEMTs), metal-semiconductor field-effect transistors (MESFETs), gallium nitride (GaN) transistors, or the like. In one example, the first double-balanced mixer cell 10 is a nominal double-balanced mixer cell and the second double-balanced mixer cell 20 is an inverted configuration of the first double-balanced mixer cell 10.

Figure 2:
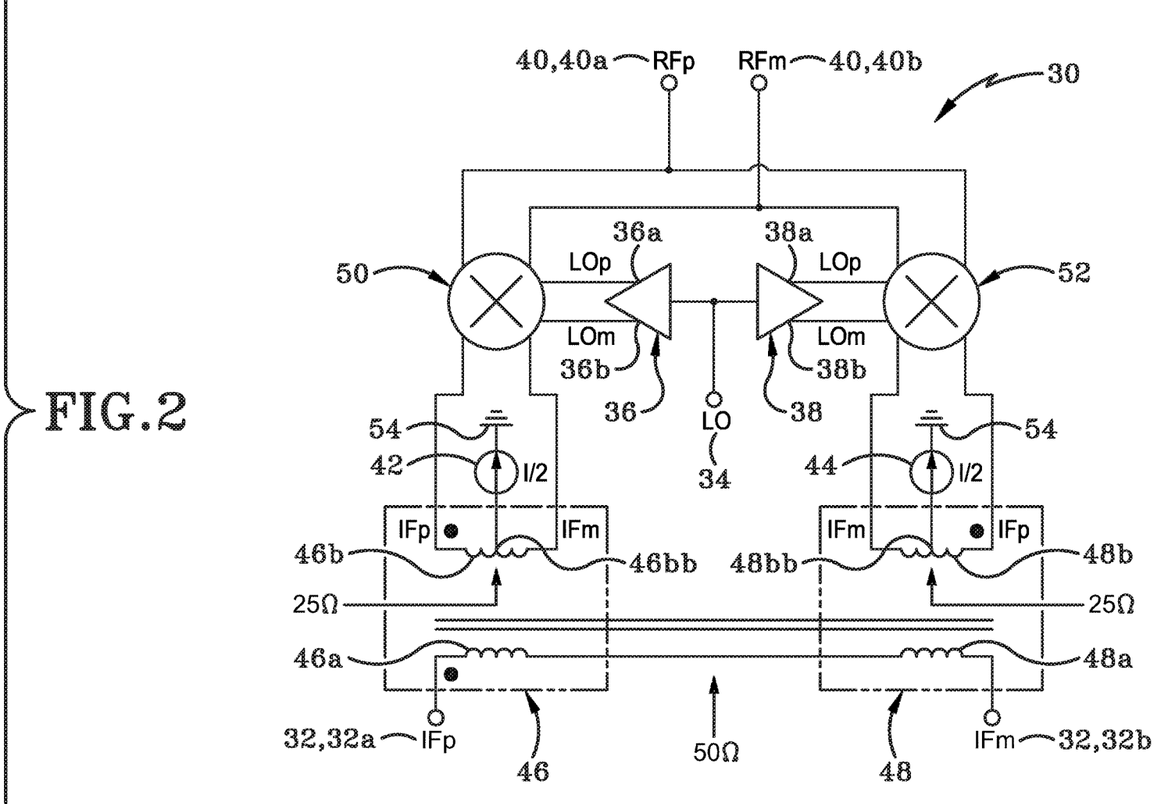
FIG. 2 is a schematic view of a first embodiment of a triple-balanced radio frequency (RF) mixer apparatus in accordance with one aspect of the present disclosure.

FIG. 2 is a schematic view of a first embodiment of a triple-balanced radio frequency (RF) mixer apparatus 30, which may also be referred to as a triple-balanced mixer, in accordance with one aspect of the present disclosure. The triple-balanced mixer 30 includes a differential IF input port 32 having a first intermediate frequency (IF) input terminal 32a, which may also be referred to as a positive IF input terminal IFp, and a second IF input terminal 32b, which may also be referred to as a negative IF input terminal IFm, a single-ended local oscillator (LO) input port 34, a first amplifier mechanism 36 having a first LO output terminal 36a, which may also be referred to as a first positive LO output terminal LOp, and a second LO output terminal 36b, which may also be referred to as a first negative LO output terminal LOm, a second amplifier mechanism 38 having a third LO output terminal 38a, which may also be referred to as a third positive LO input terminal LOp and a fourth LO output terminal 38b, which may also be referred to as a fourth negative LO output terminal LOm, and a differential RF output port 40 having a first RF output terminal 40a, which may also be referred to as a positive RF input terminal RFp, and a second RF output terminal 40b, which may also be referred to as a negative RF input terminal RFm.

The triple-balanced mixer 30 further includes a first current source 42, a second current source 44, a first transformer 46, a second transformer 48, a first mixer cell 50, a second mixer cell 52, a load mechanism (not shown), and a plurality of grounds 54. The first mixer cell 50 may also be referred to as first double-balanced mixer cell, first commutator cell, first commutator switching core, first mixer core, first commutating quad, first mixing quad, first quad core or first mixing mechanism. The second mixer cell 52 may also be referred to as second double-balanced mixer cell, second commutator cell, second commutator switching core, second mixer core, second commutating quad, second mixing quad, second quad core, or second mixing mechanism.

The first transformer 46 includes a primary 46*a* and a secondary 46*b* which includes a center tap 46*bb*. The second transformer 48 includes a primary 48*a* and a secondary 48*b* which includes a center tap 48*bb*. In one example, the first transformer 46 and the second transformer 48 are 1:1 planar transformers; however, any suitable transformers may be utilized, such as, for example, planar spiral transformers, spiral baluns, wire-wound transformers, slab transformers, or the like. It should be noted that the selection of the type of transformers may be dependent, at least in part, on the desired operational frequencies of the triple-balanced mixer 30 of the present disclosure.

Although the load mechanism is not shown, it is envisioned that the load mechanism may include a voltage supply, a first resistor and a second resistor. It is also envisioned that the load mechanism may further include a first pull-up inductor and a second pull-up inductor. Although a particular load mechanism has been identified, it is to be understood that the load mechanism may be any suitable load mechanism.

The single-ended local oscillator (LO) input port 34 is connected to the first amplifier mechanism 36 and the second amplifier mechanism 38. The first LO output terminal 36*a* is connected to the first mixer cell 50 and the second LO output terminal 36*b* is connected to the first mixer cell 50. The third LO output terminal 38*a* is connected to the second mixer cell 52 and the fourth LO output terminal 38*b* is connected to the second mixer cell 52.

The primary 46*a* of the first transformer 46 is connected to the positive IF input terminal IFp and the primary 46*a* of the second transformer 48 in series. The primary 48*a* of the second transformer 48 is connected to the negative IF input terminal IFm.

The secondary 46*b* of the first transformer 46 is connected to the first mixer cell 50 and the first current source 42 via center tap 46*bb*. The first current source 42 is connected to one of the plurality of grounds 54. The first mixer cell 50 is connected to the first RF output port 40*a* and the second RF output port 40*b*. The secondary 48*b* of the second transformer 48 is connected to the second mixer cell 52 and the second current source 44 via center tap 48*bb*. The second current source 44 is connected to one of the plurality of grounds 54. The second mixer cell 52 is connected to the first RF output terminal 40*a* and the second RF output terminal 40*b*. The load mechanism (not shown) is connected to the first RF output terminal 40*a* and the second RF output terminal 40*b*.

Figure 4:
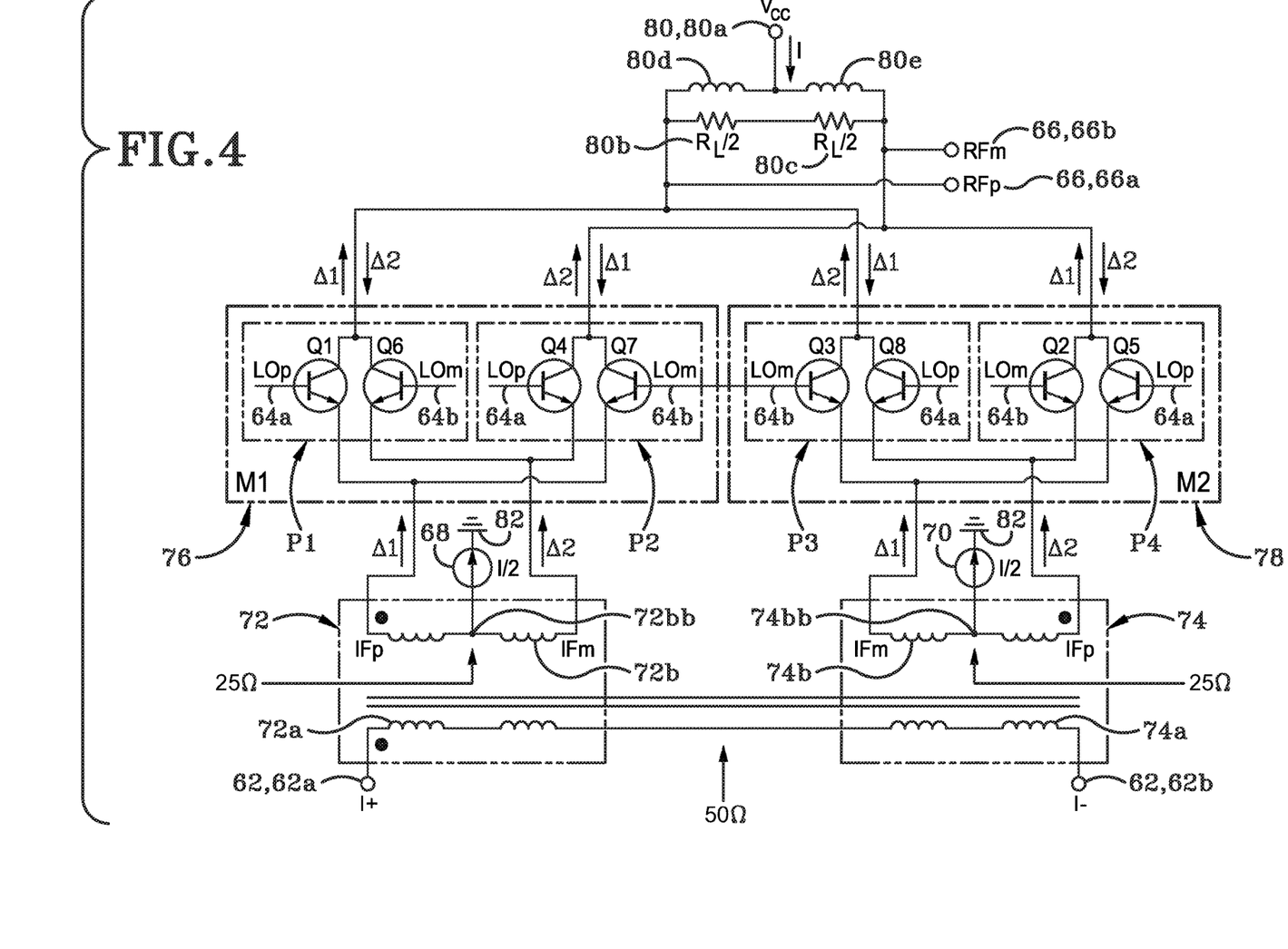
FIG. 4 is a schematic view of the second embodiment of the triple-balanced RF mixer apparatus showing the operation of the second embodiment of the triple-balanced RF mixer apparatus.

A general description of the operation of the triple-balanced mixer 30 will be provided, and, a more detailed description will be provided below. Generally, at least one non-ideality source, represented as $\Delta 1$ and $\Delta 2$ in FIG. 4, provides at least one non-ideality, which is defined as any imbalance within the triple-balanced mixer 30, such as, for example, imbalances due to random and/or systematic spurs and leakages, which may also be referred to as feedthroughs. Exemplary non-ideality sources include, but are not limited to, mismatch combinations and offsets. In one example, the at least one non-ideality source provides two non-idealities in opposite phase that are canceled at the RF outport port of the triple-balanced mixer 30. More particularly, the triple-balanced mixer 30 utilizes two double-balanced mixers, one being a nominal double-balanced mixer and the other being an inversion of the nominal double-balanced mixer. The nominal double-balanced mixer and the inverted double-balanced mixer cancel the two non-idealities at the outputs of the nominal double-balanced mixer and the inverted double-balanced mixer.

Figure 3:
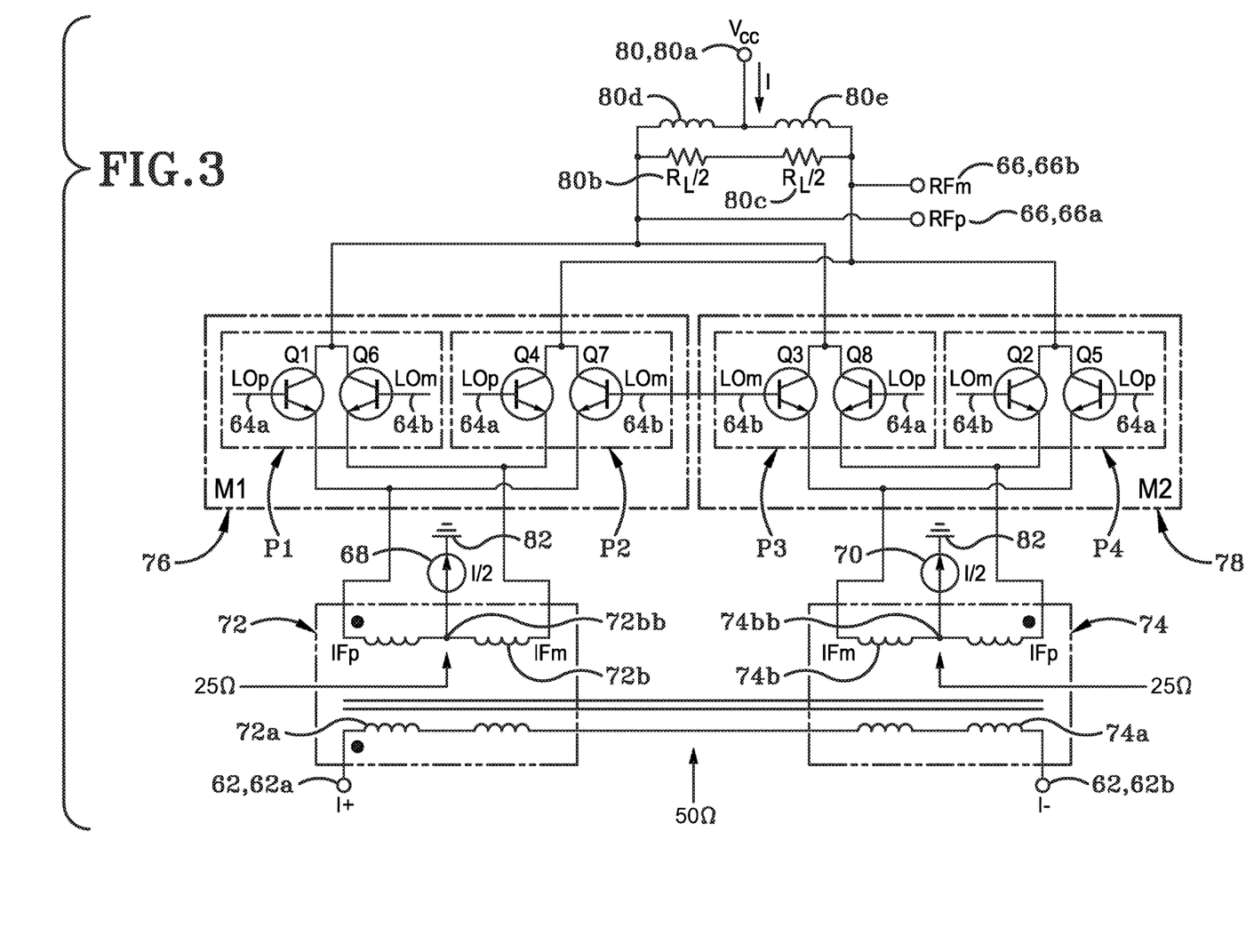
FIG. 3 is a schematic view of a second embodiment of a triple-balanced RF mixer apparatus in accordance with one aspect of the present disclosure.

FIG. 3 is a schematic view of a second embodiment of a triple-balanced radio frequency (RF) mixer apparatus 60, which may also be referred to as a triple-balanced mixer, in accordance with one aspect of the present disclosure. The triple-balanced mixer 60 is substantially identical to the triple balanced mixer 30 of FIG. 2, however, the double-balanced mixer cells and the connections associated with the double-balanced mixer cells are described in further detail.

The triple-balanced mixer 60 includes a differential IF input port 62 having a first intermediate frequency (IF) input terminal 62*a*, which may also be referred to as a positive IF input terminal IFp, and a second IF input terminal 62*b*, which may also be referred to as a negative IF input terminal IFm, a plurality of positive LO output connections 64*a*, which may also be referred to as LOp, a plurality of negative LO output connections 64*b*, which may also be referred to as LOm, and a differential RF output port 66 having a first RF output terminal 66*a*, which may also be referred to as a positive RF input terminal RFp, and a second RF output terminal 66*b*, which may also be referred to as a negative RF input terminal RFm.

The triple-balanced mixer 60 further includes a first current source 68, a second current source 70, a first transformer 72, a second transformer 74, a first mixer cell 76, a second mixer cell 78, a load mechanism 80, and a plurality of grounds 82. The first mixer cell 76 may also be referred to as first double-balanced mixer cell, first commutator cell, first commutator switching core, first mixer core, first commutating quad, first mixing quad, first quad core or first mixing mechanism. The second mixer cell 78 may also be referred to as second double-balanced mixer cell, second commutator cell, second commutator switching core, second mixer core, second commutating quad, second mixing quad, second quad core, or second mixing mechanism.

The first transformer 72 includes a primary 72*a* and a secondary 72*b* which includes a center tap 72*bb*. The second transformer 74 includes a primary 74*a* and a secondary 74*b* which includes a center tap 74*bb*. In one example, the first transformer 72 and the second transformer 74 are 1:1 planar transformers; however, any suitable transformers may be utilized, such as, for example, planar spiral transformers, spiral baluns, wire-wound transformers, slab transformers, or the like. It should be noted that the selection of the type of transformers may be dependent, at least in part, on the desired operational frequencies of the triple-balanced mixer 60 of the present disclosure.

The load mechanism 80 includes a voltage supply 80*a*, a first resistor 80*b*, a second resistor 80*c*, a first pull-up inductor 80*d*, and a second pull-up inductor 80*e*.

The primary 72*a* of the first transformer 72 is connected to the positive IF input terminal IFp and the primary 74*a* of the second transformer 74 in series. The primary 74*a* of the second transformer 74 is connected to the negative IF input terminal IFm.

The secondary 72*b* of the first transformer 72 is connected to the first mixer cell 76 and the first current source 68 via center tap 72*bb*. The first current source 68 is connected to one of the plurality of grounds 82. The first mixer cell 76 is connected to the first RF output terminal 66*a* and the second RF output terminal 66b. The secondary 74b of the second transformer 74 is connected to the second mixer cell 78 and the second current source 70 via center tap 78bb. The second current source 70 is connected to one of the plurality of grounds 82. The second mixer cell 78 is connected to the first RF output terminal 66a and the second RF output terminal 66b.

In one particular embodiment, the first transistor Q1, the second transistor Q2, the third transistor Q3, and the fourth transistor Q4 of the first double-balanced mixer cell 10 and the fifth transistor Q5, the sixth transistor Q6, the seventh transistor Q7, and the eighth transistor Q8 of the second double-balanced mixer cell 20 are formed into transistor pairs and rearranged for symmetry to form the first mixer cell 76 and second mixer cell 78 of the second embodiment of the triple-balanced mixer 60. As shown in FIG. 3, Q1 and Q6 form a first transistor pair P1 of the first mixer cell 76, Q4 and Q7 form a second transistor pair P2 of the first mixer cell 76, Q3 and Q8 form a third transistor pair P3 of the second mixer cell 78, and Q2 and Q5 form a fourth transistor pair P4 of the second mixer cell 78.

The emitter of the first transistor Q1 is connected to the positive IF input terminal IFp, the base of the first transistor Q1 is connected to the positive LO input terminal LOp, and the collector of the first transistor Q1 is connected to the positive RF input terminal RFp. The emitter of the sixth transistor Q6 is connected to the negative IF input terminal IFm, the base of the sixth transistor Q6 is connected to the negative LO input terminal LOm, and the collector of the sixth transistor Q6 is connected to the positive RF input terminal RFp.

The emitter of the fourth transistor Q4 is connected to the negative IF input terminal IFm, the base of the fourth transistor Q4 is connected to the positive LO input terminal LOp, and the collector of the fourth transistor Q4 is connected to the negative RF input terminal RFm. The emitter of the seventh transistor Q7 is connected to the positive IF input terminal IFp, the base of the seventh transistor Q7 is connected to the negative LO input terminal LOm, and the collector of the seventh transistor Q7 is connected to the negative RF input terminal RFm.

The emitter of the third transistor Q3 is connected to the negative IF input terminal IFm, the base of the third transistor Q3 is connected to the negative LO input terminal LOm, and the collector of the third transistor Q3 is connected to the positive RF input terminal RFp. The emitter of the eighth transistor Q8 is connected to the positive IF input terminal IFp, the base of the eighth transistor Q8 is connected to the positive LO input terminal LOp, and the collector of the eighth transistor Q8 is connected to the positive RF input terminal RFp.

The emitter of the second transistor Q2 is connected to the positive IF input terminal IFp, the base of the second transistor Q2 is connected to the negative LO input terminal LOm, and the collector of the second transistor Q2 is connected to the negative RF input terminal RFm. The emitter of the fifth transistor Q5 is connected to the negative IF input terminal IFm, the base of the fifth transistor Q5 is connected to the positive LO input terminal LOp, and the collector of the fifth transistor Q5 is connected to the negative RF input terminal RFm.

The first resistor 80b and the first pull-up inductor 80d are connected to the first RF output terminal 66a and the voltage supply 80a. The second resistor 80c and the second pull-up inductor 80e are connected to the second RF output terminal 66b and the voltage supply 80a.

The operation of the triple-balanced mixer 60 will be described in relation to FIG. 4, which is the substantially identical to FIG. 3, with the addition of indicia as further described below. The at least one non-ideality source provides at least one non-ideality within the triple-balanced mixer 60. The non-idealities, which are defined above as any imbalance within the triple-balanced mixer, such as, for example, imbalances due to random and/or systematic spurs and leakages, associated with the triple-balanced mixer 60 are represented as Δ1 and Δ2 with arrows indicating a direction of the phase of the non-idealities.

As shown in FIG. 4, Δ1 and Δ2 enter the first mixer cell 76 and the second mixer cell 78 in the same sense. Stated otherwise, Δ1 and Δ2 enter the first mixer cell 76 and the second mixer cell 78 in the same phase. The first transistor pair P1 of the first mixer cell 76 outputs a Δ1 and Δ2 in opposite phases that are fed to the positive RF input terminal RFp, the second transistor pair P2 of the first mixer cell 76 outputs a Δ1 and Δ2 in opposite phases that are fed to the negative RF input terminal RFm, the third transistor pair P3 of the second mixer cell 78 outputs a Δ1 and Δ2 in opposite phases that are fed to the positive RF input terminal RFp, and the fourth transistor pair P4 of the second mixer cell 78 outputs a Δ1 and Δ2 in opposite phases that are fed to the negative RF input terminal RFm. Therefore, the Δ1 and Δ2 of the first transistor pair P1 and Δ1 and Δ2 of the third transistor pair P3 are equal and opposite in phase and are cancelled out at the positive RF input terminal RFp. Likewise, the Δ1 and Δ2 of the second transistor pair P2 and Δ1 and Δ2 of the fourth transistor pair P4 are equal and opposite in phase and are cancelled out at the negative RF input terminal RFm. Therefore, the triple-balanced mixer 60 eliminates the non-idealities at the positive RF input terminal RFp and the negative RF input terminal RFm.

Figure 5:
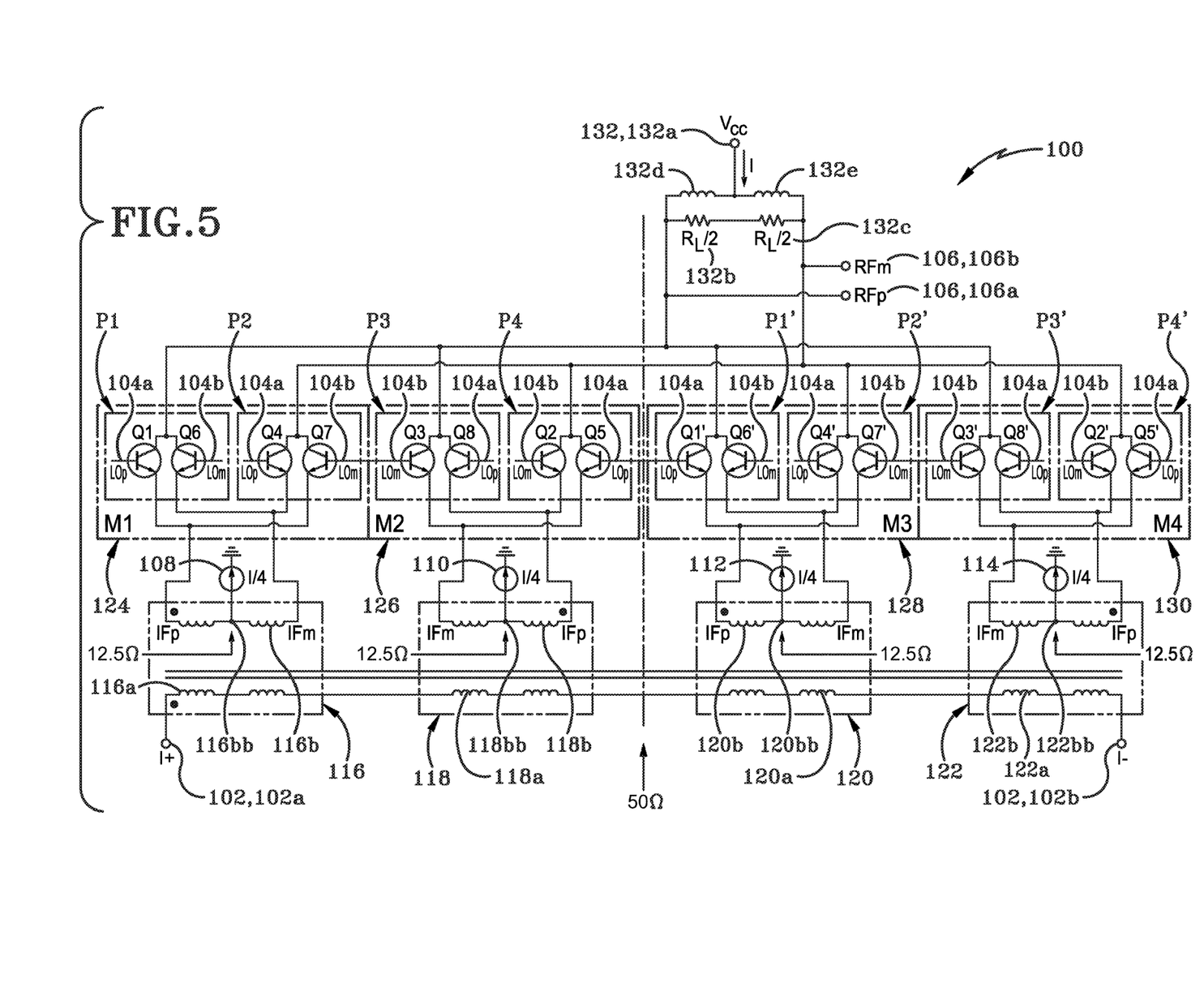
FIG. 5 is a schematic view of a third embodiment of a triple-balanced RF mixer apparatus in accordance with one aspect of the present disclosure.

FIG. 5 is a schematic view of a third embodiment of a triple-balanced radio frequency (RF) mixer apparatus 100, which may also be referred to as a triple-balanced mixer, in accordance with one aspect of the present disclosure. The triple-balanced mixer 100 includes a differential IF input port 102 having a first intermediate frequency (IF) input terminal 102a, which may also be referred to as a positive IF input terminal IFp, and a second IF input terminal 102b, which may also be referred to as a negative IF input terminal IFm, a plurality of positive LO output connections 104a, which may also be referred to as LOp, a plurality of negative LO output connections 104b, which may also be referred to as LOm, and a differential RF output port 106 having a first RF output terminal 106a, which may also be referred to as a positive RF input terminal RFp, and a second RF output terminal 106b, which may also be referred to as a negative RF input terminal RFm.

The triple-balanced mixer 100 further includes a first current source 108, a second current source 110, a third current source 112, a fourth current source 114, a first transformer 116, a second transformer 118, a third transformer 120, and a fourth transformer 122, a first mixer cell 124, a second mixer cell 126, a third mixer cell 128, a fourth mixer cell 130, a load mechanism 132, and a plurality of grounds 134. The first mixer cell 124 may also be referred to as first double-balanced mixer cell, first commutator cell, first commutator switching core, first mixer core, first commutating quad, first mixing quad, first quad core or first mixing mechanism. The second mixer cell 126 may also be referred to as second double-balanced mixer cell, second commutator cell, second commutator switching core, second mixer core, second commutating quad, second mixing quad, second quad core, or second mixing mechanism. The third mixer cell 128 may also be referred to as third double-balanced mixer cell, third commutator cell, third commutator switching core, third mixer core, third commutating quad, third mixing quad, third quad core, or third mixing mechanism. The fourth mixer cell 130 may also be referred to as fourth double-balanced mixer cell, fourth commutator cell, fourth commutator switching core, fourth mixer core, fourth commutating quad, fourth mixing quad, fourth quad core, or fourth mixing mechanism.

The first transformer 116 includes a primary 116a and a secondary 116b which includes a center tap 116bb. The second transformer 118 includes a primary 118a and a secondary 118b which includes a center tap 118bb. The third transformer 120 includes a primary 120a and a secondary 120b which includes a center tap 120bb. The fourth transformer 122 includes a primary 122a and a secondary 122b which includes a center tap 122bb. In one example, the first transformer 116, the second transformer 118, the third transformer 120, and the fourth transformer are 1:1 planar transformers; however, any suitable transformers may be utilized, such as, for example, planar spiral transformers, spiral baluns, wire-wound transformers, slab transformers, or the like. It should be noted that the selection of the type of transformers may be dependent, at least in part, on the desired operational frequencies of the triple-balanced mixer 100 of the present disclosure.

The load mechanism 132 includes a voltage supply 132a, a first resistor 132b, a second resistor 132c, a first pull-up inductor 132d, and a second pull-up inductor 132e.

The primary 116a of the first transformer 116 is connected to the positive IF input terminal IFp and the primary 118a of the second transformer 118 in series. The primary 118a of the second transformer 118 is connected to the primary 120a of the third transformer 120 in series. The primary 120a of the third transformer 120 is connected to the primary 122a of the fourth transformer 122 in series. The primary 122a of the fourth transformer 122 is connected to the negative IF input terminal IFm.

The secondary 116b of the first transformer 116 is connected to the first mixer cell 124 and the first current source 108 via center tap 116bb. The first current source 108 is connected to one of the plurality of grounds 134. The first mixer cell 124 is connected to the first RF output terminal 106a and the second RF output terminal 106b. The secondary 118b of the second transformer 118 is connected to the second mixer cell 126 and the second current source 110 via center tap 118bb. The second current source 110 is connected to one of the plurality of grounds 134. The second mixer cell 126 is connected to the first RF output terminal 106a and the second RF output terminal 106b. The secondary 120b of the third transformer 120 is connected to the third mixer cell 128 and the third current source 112 via center tap 120bb. The third current source 112 is connected to one of the plurality of grounds 134. The third mixer cell 128 is connected to the first RF output terminal 106a and the second RF output terminal 106b. The secondary 122b of the fourth transformer 122 is connected to the fourth mixer cell 130 and the fourth current source 114 via center tap 122bb. The fourth current source 114 is connected to one of the plurality of grounds 134. The fourth mixer cell 130 is connected to the first RF output terminal 106a and the second RF output terminal 106b.

More particularly, the first transistor Q1, the second transistor Q2, the third transistor Q3, and the fourth transistor Q4 of the first double-balanced mixer cell 10 and the fifth transistor Q5, the sixth transistor Q6, the seventh transistor Q7, and the eighth transistor Q8 of the second double-balanced mixer cell 20 are formed into pairs and rearranged for symmetry to form the first mixer cell 124 and second mixer cell 126 of the third embodiment of the triple-balanced mixer cell 100. As shown in FIG. 5, Q1 and Q6 form a first transistor pair P1 of the first mixer cell 124, Q4 and Q7 form a second transistor pair P2 of the first mixer cell 124, Q3 and Q8 form a third transistor pair P3 of the second mixer cell 126, and Q2 and Q5 form a fourth transistor pair P4 of the second mixer cell 126.

The third mixer cell 128 and the fourth mixer cell 130 are substantially identical to the first mixer cell 124 and the second mixer cell 126 and are thus configured in a substantially identical manner. As such, similar reference numerals will be used to describe the third mixer cell 128 and the fourth mixer cell 130 with the addition of the prime symbol "'" after each reference numeral. For example, the first transistor Q1, the second transistor Q2, the third transistor Q3, and the fourth transistor Q4 of the first double-balanced mixer cell 10 are referred to as Q1', Q2', Q3', and Q4' respectively, and the fifth transistor Q5, the sixth transistor Q6, the seventh transistor Q7, and the eighth transistor Q8 of the second double-balanced mixer cell 20 are referred to as Q5', Q6', Q7', and Q8' respectively. The first transistor Q1', the second transistor Q2', the third transistor Q3', and the fourth transistor Q4' of the first double-balanced mixer cell 10 and the fifth transistor Q5', the sixth transistor Q6', the seventh transistor Q7', and the eighth transistor Q8' of the second double-balanced mixer cell 20 are formed into pairs and rearranged for symmetry to form the third mixer cell 128 and the fourth mixer cell 130 of the third embodiment of the triple-balanced mixer cell 100. As shown in FIG. 5, Q1' and Q6' form a first transistor pair P1' of the third mixer cell 128, Q4' and Q7' form a second transistor pair P2' of the third mixer cell 128, Q3 and Q8 form a third transistor pair P3' of the fourth mixer cell 130, and Q2 and Q5 form a fourth transistor pair P4' of the fourth mixer cell 130.

The emitter of the first transistor Q1 is connected to the positive IF input terminal IFp, the base of the first transistor Q1 is connected to the positive LO input terminal LOp, and the collector of the first transistor Q1 is connected to the positive RF input terminal RFp. The emitter of the sixth transistor Q6 is connected to the negative IF input terminal IFm, the base of the sixth transistor Q6 is connected to the negative LO input terminal LOm, and the collector of the sixth transistor Q6 is connected to the positive RF input terminal RFp.

The emitter of the fourth transistor Q4 is connected to the negative IF input terminal IFm, the base of the fourth transistor Q4 is connected to the positive LO input terminal LOp, and the collector of the fourth transistor Q4 is connected to the negative RF input terminal RFm. The emitter of the seventh transistor Q7 is connected to the positive IF input terminal IFp, the base of the seventh transistor Q7 is connected to the negative LO input terminal LOm, and the collector of the seventh transistor Q7 is connected to the negative RF input terminal RFm.

The emitter of the third transistor Q3 is connected to the negative IF input terminal IFm, the base of the third transistor Q3 is connected to the negative LO input terminal LOm, and the collector of the third transistor Q3 is connected to the positive RF input terminal RFp. The emitter of the eighth transistor Q8 is connected to the positive IF input terminal IFp, the base of the eighth transistor Q8 is connected to the positive LO input terminal LOp, and the collector of the eighth transistor Q8 is connected to the positive RF input terminal RFp.

The emitter of the second transistor Q2 is connected to the positive IF input terminal IFp, the base of the second transistor Q2 is connected to the negative LO input terminal LOm, and the collector of the second transistor Q2 is connected to the negative RF input terminal RFm. The emitter of the fifth transistor Q5 is connected to the negative IF input terminal IFm, the base of the fifth transistor Q5 is connected to the positive LO input terminal LOp, and the collector of the fifth transistor Q5 is connected to the negative RF input terminal RFm.

The emitter of the first transistor Q1' is connected to the positive IF input terminal IFp, the base of the first transistor Q1' is connected to the positive LO input terminal LOp, and the collector of the first transistor Q1' is connected to the positive RF input terminal RFp. The emitter of the sixth transistor Q6' is connected to the negative IF input terminal IFm, the base of the sixth transistor Q6' is connected to the negative LO input terminal LOm, and the collector of the sixth transistor Q6' is connected to the positive RF input terminal RFp.

The emitter of the fourth transistor Q4' is connected to the negative IF input terminal IFm, the base of the fourth transistor Q4' is connected to the positive LO input terminal LOp, and the collector of the fourth transistor Q4' is connected to the negative RF input terminal RFm. The emitter of the seventh transistor Q7' is connected to the positive IF input terminal IFp, the base of the seventh transistor Q7' is connected to the negative LO input terminal LOm, and the collector of the seventh transistor Q7' is connected to the negative RF input terminal RFm.

The emitter of the third transistor Q3' is connected to the negative IF input terminal IFm, the base of the third transistor Q3' is connected to the negative LO input terminal LOm, and the collector of the third transistor Q3' is connected to the positive RF input terminal RFp. The emitter of the eighth transistor Q8' is connected to the positive IF input terminal IFp, the base of the eighth transistor Q8' is connected to the positive LO input terminal LOp, and the collector of the eighth transistor Q8' is connected to the positive RF input terminal RFp.

The emitter of the second transistor Q2' is connected to the positive IF input terminal IFp, the base of the second transistor Q2' is connected to the negative LO input terminal LOm, and the collector of the second transistor Q2' is connected to the negative RF input terminal RFm. The emitter of the fifth transistor Q5' is connected to the negative IF input terminal IFm, the base of the fifth transistor Q5' is connected to the positive LO input terminal LOp, and the collector of the fifth transistor Q5' is connected to the negative RF input terminal RFm.

The first resistor 132b and the first pull-up inductor 132d are connected to the first RF output terminal 106a and the voltage supply 132a. The second resistor 132c and the second pull-up inductor 132e are connected to the second RF output terminal 106b and the voltage supply 132a.

The operation of the triple-balanced mixer 100 is substantially identical to the operation of the triple-balanced mixer 60, in structure and function with a few exceptions/additions that will be discussed hereafter in greater detail. Instead of utilizing two double-balanced mixer cells, the triple-balanced mixer 100 utilizes four double-balanced mixer cells. Therefore, and although not shown, the non-idealities are canceled at the positive RF input terminal RFp and the negative RF input terminal RFm.

In this embodiment, the non-idealities enter the first mixer cell 124, the second mixer cell 126, the third mixer cell 128, and the fourth mixer cell 130 in the same sense. Stated otherwise, the non-idealities enter the first mixer cell 124, the second mixer cell 126, the third mixer cell 128, and the fourth mixer cell 130 in the same phase. The first transistor pair P1 of the first mixer cell 124 outputs non-idealities in opposite phases that are fed to the positive RF input terminal RFp, the second transistor pair P2 of the first mixer cell 124 outputs non-idealities in opposite phases that are fed to the negative RF input terminal RFm, the third transistor pair P3 of the second mixer cell 126 outputs non-idealities in opposite phases that are fed to the positive RF input terminal RFp, and the fourth transistor pair P4 of the second mixer cell 126 outputs non-idealities in opposite phases that are fed to the negative RF input terminal RFm.

The fifth transistor pair P1' of the third mixer cell 128 outputs non-idealities in opposite phases that are fed to the positive RF input terminal RFp, the sixth transistor pair P2' of the third mixer cell 128 outputs non-idealities in opposite phases that are fed to the negative RF input terminal RFm, the seventh transistor pair P3' of the fourth mixer cell 130 outputs non-idealities in opposite phases that are fed to the positive RF input terminal RFp, and the eighth transistor pair P4' of the fourth mixer cell 130 outputs non-idealities in opposite phases that are fed to the negative RF input terminal RFm.

Therefore, the non-idealities of the first transistor pair P1, the third transistor pair P3, the fifth transistor pair P1', and the seventh transistor pair P3' are equal and opposite in phase and are cancelled out at the positive RF input terminal RFp. Likewise, the non-idealities of the second transistor pair P2, the fourth transistor pair P4, the sixth transistor pair P2', and the eighth transistor pair P4' are equal and opposite in phase and are cancelled out at the negative RF input terminal RFm. Therefore, the triple-balanced mixer 100 eliminates the non-idealities at the positive RF input terminal RFp and the negative RF input terminal RFm.

Figure 6:
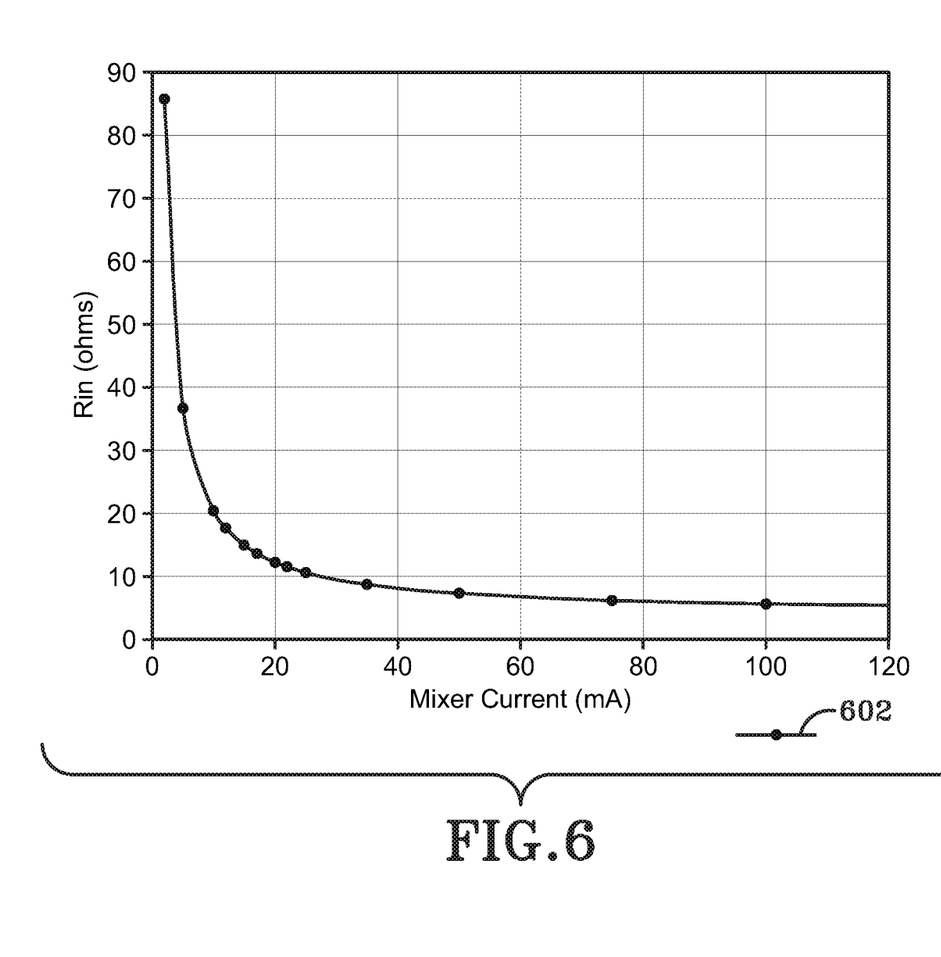
FIG. 6 is a graph of input impedance of a double-balanced mixer cell in accordance with the present disclosure versus DC current through the double-balanced mixer cell.

FIG. 6 is a graph of input impedance of a double-balanced mixer cell, such as, for example, the first double-balanced mixer cell 10 or the second double-balanced mixer cell 20, versus DC current through the double-balanced mixer cell. The y-axis is RF impedance in $\Omega$ and the x-axis is mixer current in milliamps (mA). Line 602 represents the RF impedance. As shown in FIG. 6, as the double-balanced mixer current increases, the RF impedance of the double-balanced mixer cell decreases. As shown in FIG. 6, the RF impedance can be as low as approximately six ohms ($\Omega$) (including transformer loss) at 50 mA DC.

Figure 7:
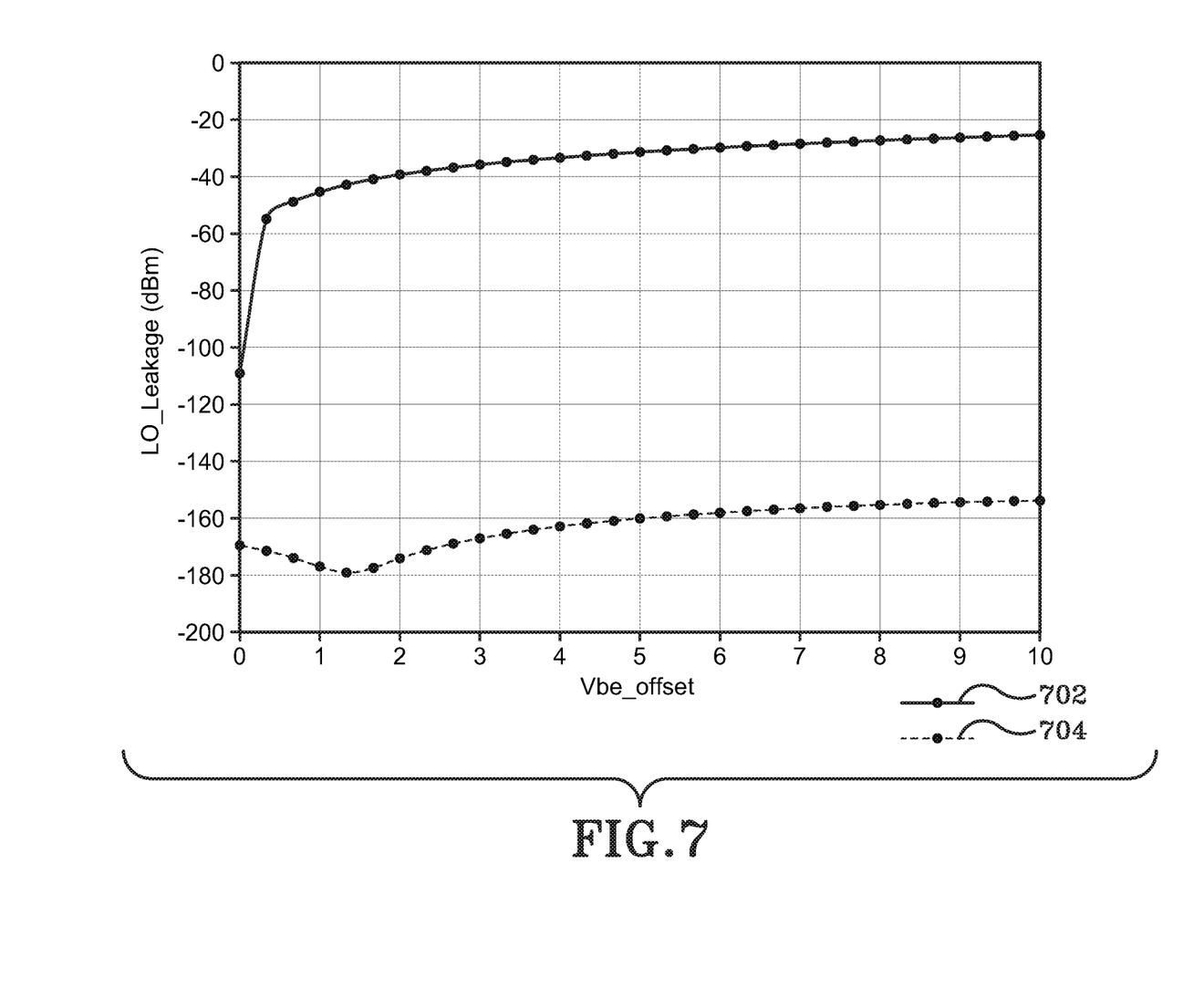
FIG. 7 is a graph comparing LO carrier leakage due to offsets of a conventional triple-balanced mixer utilizing two Gilbert cell mixers and offsets of a double-balanced mixer cell in accordance with the present disclosure.

FIG. 7 is a graph comparing LO carrier leakage due to offsets of a conventional triple-balanced mixer utilizing two Gilbert cell mixers and offsets of a double-balanced mixer cell in accordance with the present disclosure, such as, for example, the triple-balanced mixer 30, the triple-balanced mixer 60, or the triple-balanced mixer 100. Line 702 represents the LO carrier leakage of the conventional triple-balanced mixer utilizing the two Gilbert cell mixers and line 704 represents the LO carrier leakage of the triple-balanced mixers 30, 60, 100 of the present disclosure. As shown in FIG. 7, the triple-balanced mixers 30, 60, 100 of the present disclosure have significantly less LO carrier leakage compared to the conventional triple-balanced mixer utilizing the two Gilbert cell mixers.

Figure 8:
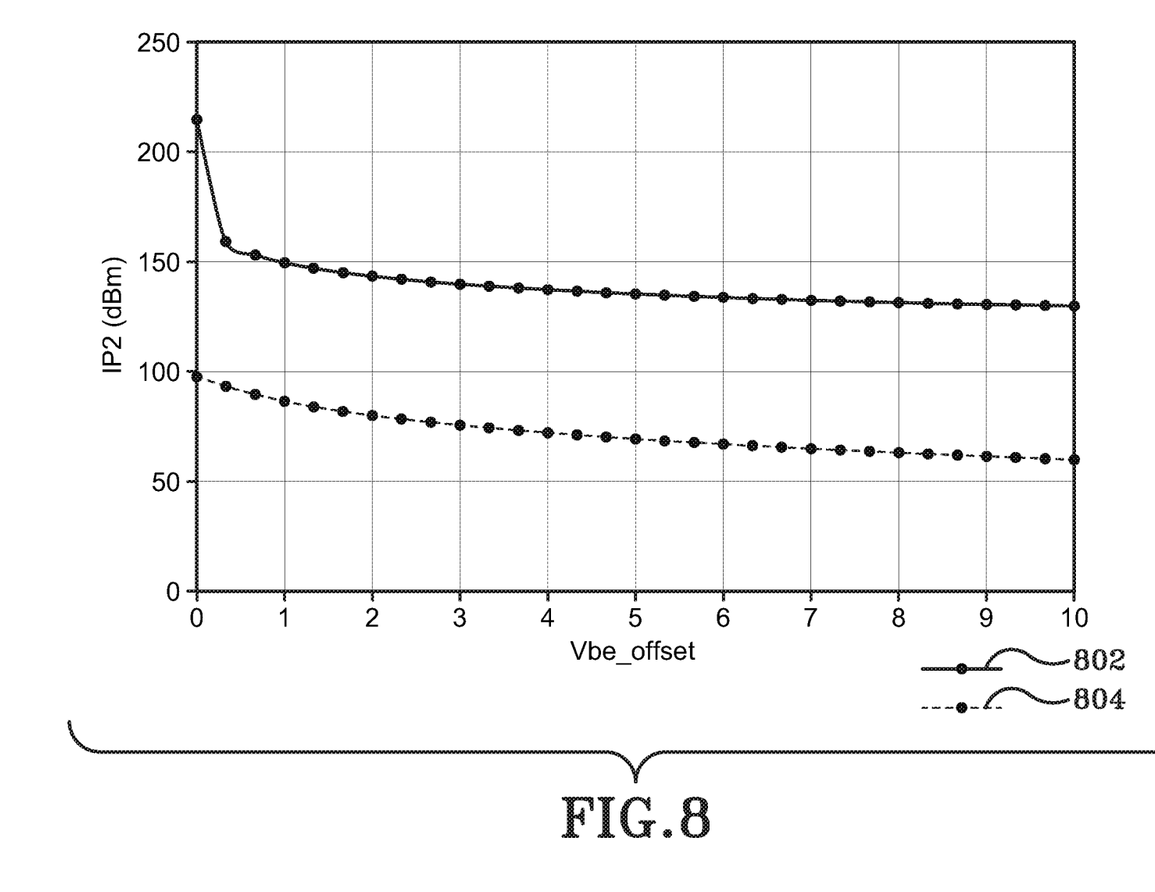
FIG. 8 is a graph comparing a Gilbert cell device offset and PEM cell offset effect on 2×2 (IP2) spurious performance.

FIG. 8 is a graph comparing effect on 2×2 (IP2) spurious performance due to offsets of a conventional triple-balanced mixer utilizing two Gilbert cell mixers and offsets of a double-balanced mixer cell in accordance with the present disclosure, such as, for example, the triple-balanced mixer 30, the triple-balanced mixer 60, or the triple-balanced mixer 100. Line 802 represents the IP2 of the triple-balanced mixer 30, 60, 100 of the present disclosure and line 804 represents the IP2 of the conventional triple-balanced mixer utilizing the two Gilbert cell mixers. As shown in FIG. 8, the triple-balanced mixers 30, 60, 100 of the present disclosure have significantly higher IP2 compared to the conventional triple-balanced mixer utilizing the two Gilbert cell mixers.

Some of the benefits of the triple-balanced mixers 30, 60, 100 of the present disclosure compared to conventional double-balanced mixers and conventional triple-balanced mixers include, but are not limited to, improved LO carrier leakage, improved input intercept point (IP3), improved 1 dB compression point (P1 dB), improved 2×2 spurious levels, low voltage operation (i.e., as low as two volt (V) voltage supply required for operation), and capability of being implemented in an integrated circuit technology, such as, for example, nominal Silicon BiCMOS integrated circuit, which is a combination of Bipolar and complementary metal-oxide-semiconductor (CMOS) technology or gallium arsenide (GaAs) integrated circuit, and all LO voltage splitting can be done actively and in a compact manner.

It is further envisioned that the triple-balanced mixers 30, 60, and 100 may be configured in any suitable manner, including, but not limited to, adding or removing transformers and double-balanced mixer cells as necessary and depending on the desired design choice (e.g. a double-cell, triple-cell, or quadruple-cell configuration).

It is further envisioned that the transformers of triple-balanced mixers 30, 60, and 100 may modify the total commutator cell impedance as desired.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A triple-balanced radio frequency (RF) mixer comprising:
    a plurality of double-balanced mixer cells;
    a plurality of transformers; wherein each of the plurality of transformers includes a primary and a secondary; wherein each primary is connected in series; wherein each secondary is connected across one double-balanced mixer cell of said plurality of double-balanced mixer cells;
    a local oscillator (LO) port coupled to each of the plurality of double-balanced mixer cells in parallel;
    an output port coupled to each of the plurality of double-balanced mixer cells in parallel; and
    at least one non-ideality source providing at least one non-ideality, wherein the at least one non-ideality is cancelled at the output port.

2. The triple-balanced RF mixer of claim 1, wherein the at least one non-ideality is a second order intermodulation product.

3. The triple-balanced RF mixer of claim 1, wherein the at least one non-ideality is LO carrier leakage.

4. The triple-balanced RF mixer of claim 1, further comprising:
    a nominal double-balanced mixer cell of said plurality of double-balanced mixer cells; and
    an inverted double-balanced mixer cell of said plurality of double-balanced mixer cells; wherein the inverted double-balanced mixer cell is an inverted configuration of the nominal double-mixer cell.

5. The triple-balanced RF mixer of claim 4, further comprising:
    a first non-ideality of the at least one non-ideality; and a second non-ideality of the at least one non-ideality;
wherein the first non-ideality and the second non-ideality are canceled across the output port.

6. The triple-balanced RF mixer of claim 5, further comprising:
a first phase of the first non-ideality; and
a second phase of the second non-ideality opposite the first phase.

7. The triple-balanced RF mixer of claim 1, further comprising:
a plurality of current sources providing a total double-balanced mixer cell current to the plurality of double-balanced mixer cells.

8. The triple-balanced RF mixer of claim 7, wherein the total double-balanced mixer cell current is split substantially equally between the plurality of double-balanced mixer cells.

9. The triple-balanced RF mixer of claim 1, further comprising:
a total double-balanced mixer cell impedance presented by the plurality of double-balanced mixer cells;
an input port of the triple-balanced RF mixer; and
an RF source impedance presented to the input port;
wherein the total double-balanced mixer cell impedance is substantially matched to the RF source impedance.

10. The triple-balanced RF mixer of claim 9, wherein the plurality of transformers modifies the total double-balanced mixer cell impedance.

11. The triple-balanced RF mixer of claim 1, further comprising:
a first amplifier mechanism connected to one of the plurality of double-balanced mixer cells; and
a second amplifier mechanism connected to another of the plurality of double-balanced mixer cells; wherein the first amplifier mechanism is adapted to feed a differential LO signal to one of the plurality of double-balanced mixer cells; and wherein the second amplifier mechanism is adapted to feed the differential LO signal to another of the plurality of double-balanced mixer cells.

12. The triple-balanced RF mixer of claim 1, wherein the triple-balanced RF mixer is implemented in an integrated circuit technology.

13. The triple-balanced RF mixer of claim 12, wherein the integrated circuit technology is a silicon BiCMOS integrated circuit or a gallium arsenide (GaAs) integrated circuit.

14. The triple-balanced RF mixer of claim 1, further comprising:
a voltage supply; wherein the voltage supply is equal to or less than approximately two volts.

15. The triple-balanced RF mixer of claim 1, further comprising:
a first double-balanced mixer cell of said plurality of double-balanced mixer cells and a second double-balanced mixer cell of said plurality of double-balanced mixer cells; the first double-balanced mixer cell including a first transistor pair and a second transistor pair; the second double-balanced mixer cell including a third transistor pair and a fourth transistor pair; the output port comprising:
a positive output terminal connected to the first transistor pair and the third transistor pair; and
a negative output terminal connected to the second transistor pair and the fourth transistor pair.

16. The triple-balanced RF mixer of claim 15, further comprising:
a first non-ideality of the at least one non-ideality;
a second non-ideality of the at least one non-ideality;
a third non-ideality of the at least one non-ideality;
a fourth non-ideality of the at least one non-ideality;
wherein the first non-ideality and the third non-ideality are canceled across the positive output terminal; and
wherein the second non-ideality and the fourth non-ideality are canceled across the negative output terminal.

17. A triple-balanced radio frequency (RF) mixer, comprising:
a first pair of power efficient double-balanced mixer cells, wherein one of said first pair is an inverted power efficient double-balanced mixer cell of the other of said first pair;
a first pair of transformers each having spiral baluns having a primary and a secondary, wherein each primary is connected in series and each secondary is connected across one power efficient double-balanced mixer cell of said first pair of power efficient double-balanced mixer cells such that an RF signal is split into two balanced inputs, wherein one of the inputs is inverted;
a local oscillator (LO) port coupled to each of the power efficient double-balanced mixer cells in parallel; and
an output port coupled to each of the power efficient double-balanced mixer cells in parallel.

18. The triple-balanced RF mixer of claim 17, further comprising:
at least one of a second order intermodulation product and an inverted LO feedthrough provided by the inverted power efficient double-balanced mixer cell.

19. The triple-balanced RF mixer of claim 17, further comprising:
a total power efficient double-balanced mixer cell impedance presented by the first pair of power efficient double-balanced mixer cells;
an input port of the triple-balanced RF mixer; and
an RF source impedance presented to the input port;
wherein the total power efficient double-balanced mixer cell impedance is substantially matched to the RF source impedance.

20. The triple-balanced RF mixer of claim 17, further comprising:
a second pair of power efficient double-balanced mixer cells, wherein one of said second pair is an inverted power efficient double-balanced mixer cell of the other of said second pair; and
a second pair of transformers each having spiral baluns having a primary and a secondary, wherein each primary is connected in series and each secondary is connected across one power efficient double-balanced mixer cell of the second pair of power efficient double-balanced mixer cells such that an RF signal is split into two balanced inputs, wherein one of the inputs is inverted.

* * * * *